US009330932B1

(12) United States Patent (10) Patent No.: US 9,330,932 B1
Sills et al. (45) Date of Patent: May 3, 2016

(54) METHODS OF FABRICATING FEATURES ASSOCIATED WITH SEMICONDUCTOR SUBSTRATES

(71) Applicant: Micron Technology, Inc., Boise, ID (US)

(72) Inventors: Scott E. Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/674,302

(22) Filed: Mar. 31, 2015

(51) Int. Cl.
H01L 21/02 (2006.01)
H01L 21/308 (2006.01)
H01L 21/70 (2006.01)

(52) U.S. Cl.
CPC ...... *H01L 21/3088* (2013.01); *H01L 21/02112* (2013.01); *H01L 21/02359* (2013.01); *H01L 21/3081* (2013.01); *H01L 21/702* (2013.01)

(58) Field of Classification Search
CPC ............ H01L 21/02109; H01L 21/02296; H01L 21/02518; H01L 21/64; H01L 21/70; H01L 21/702
See application file for complete search history.

(56) References Cited

U.S. PATENT DOCUMENTS

2011/0098445 A1* 4/2011 Mattoussi .............. B82Y 15/00
530/333

OTHER PUBLICATIONS

Andersen et al., "Self-assembly of a nanoscale DNA box with a controllable lid," Nature, vol. 459, May 2009, pp. 73-77.
Kershner et al., "Placement and orientation of individual DNA shapes on lithographically patterned surfaces," Nature Nanotechnology, Published Online Aug. 16, 2009 at www.nature.com/naturenanotechnology, pp. 1-5.
Surwade et al., "Nanoscale Growth and Patterning of Inorganic Oxides Using DNA Nanostructure Templates," Journal of the American Chemcial Society, vol. 135, Apr. 10, 2013, pp. 6778-6781.
Wei et al., "Complex shapes self-assembled from single-stranded DNA tiles," Nature, vol. 485, May 31, 2012, pp. 623-627.

* cited by examiner

*Primary Examiner* — Cheung Lee
(74) *Attorney, Agent, or Firm* — Wells St. John P.S.

(57) ABSTRACT

Some embodiments include a method in which a mixture of polynucleotide structures comprises a set of surface shapes. Surface shapes of some polynucleotide structures are complementary to surface shapes of other polynucleotide structures. The complementary surface shapes lock together along interfaces between adjacent polynucleotide structures to incorporate the polynucleotide structures into a polynucleotide mask. The polynucleotide mask is used during fabrication of features associated with a semiconductor substrate. Some embodiments include a method in which a semiconductor substrate comprises registration regions configured to adhere individual polynucleotide structures to specific locations of the semiconductor substrate. The adhered polynucleotide structures are incorporated into a polynucleotide mask which is used during fabrication of features associated with the semiconductor substrate.

37 Claims, 11 Drawing Sheets

METHODS OF FABRICATING FEATURES ASSOCIATED WITH SEMICONDUCTOR SUBSTRATES

TECHNICAL FIELD

Methods of fabricating features associated with semiconductor substrates.

BACKGROUND

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having reduced feature sizes.

A typical patterned mask utilized for integrated circuit fabrication is photolithographically-patterned photoresist. Such may be utilized to form feature sizes approaching about 40 nanometers (nm). Sublithographic feature sizes may be formed utilizing pitch-multiplication methodologies (which reduce pitch size by a given multiple; for instance, pitch-doubling methodology reduces pitch size by a multiple of two). However, pitch-multiplication methodologies may be costly due to the complexities associated with such methodologies. Another method showing promise for creating sublithographic feature sizes involves self-assembly of block copolymer to form repeating patterns. Unfortunately, there is often poor control of the final pattern created with the block copolymer. Accordingly, there may be too many defects remaining in the final pattern for commercial viability.

It is desirable to develop new methods for patterning sublithographic features suitable for semiconductor fabrication.

DETAILED DESCRIPTION OF THE ILLUSTRATED EMBODIMENTS

Polymer which may be utilized to form patterns with a high degree of specificity is polynucleotide (for instance, deoxyribonucleic acid [DNA], ribonucleic acid [RNA], etc.). In some embodiments, methods are developed for utilization of polynucleotide masks for patterning of features associated with semiconductor substrates. In some embodiments the features may be sublithographic, and may have dimensions much smaller than 40 nm; such as, for example, dimensions of less than or equal to about 10 nm, less than or equal to about 5 nm, etc.

For purposes of interpreting this disclosure and the claims that follow, the term "polynucleotide" means a polymer comprising two or more nucleotides. There is some historic distinction between polymers referred to as "polynucleotide" and polymers referred to as "oligonucleotide", with both comprising the same subunits and "polynucleotides" being understood to be longer than "oligonucleotides". For purposes of interpreting this disclosure and the claims that follow, the term "polynucleotide" is used to encompass all polymer lengths, and accordingly to generically encompass polymer lengths sometimes referred to in the art as "oligonucleotides", as well as the longer polymer lengths.

Example embodiments are described below with reference to FIGS. 1-27.

Figure 1:
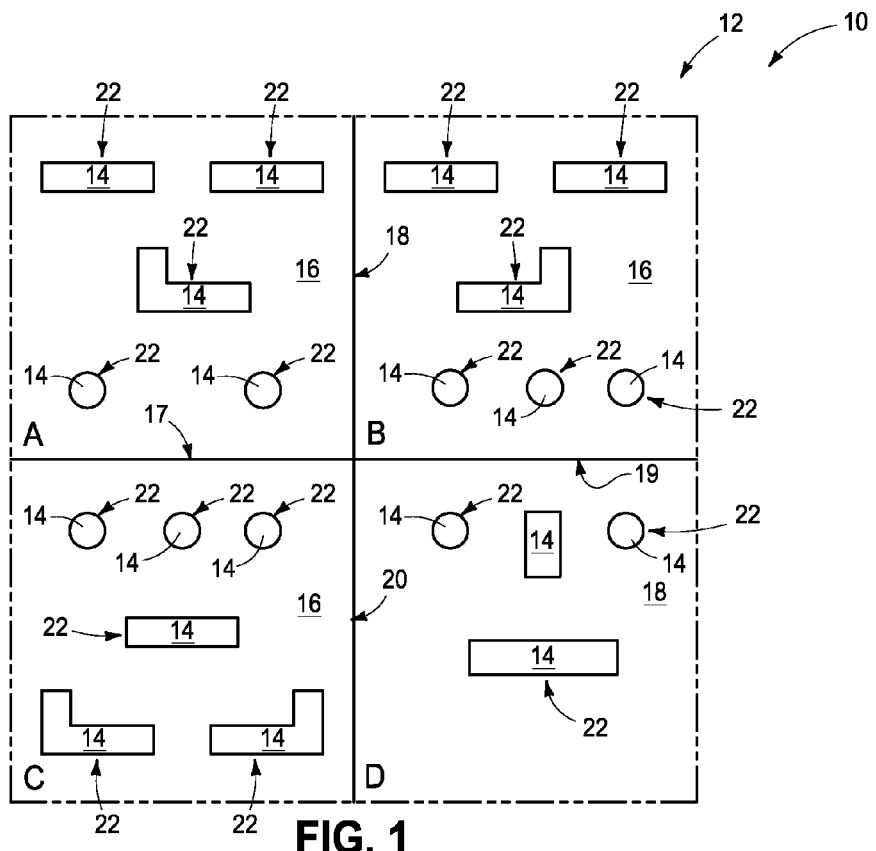
FIGS. 1 and 2 are diagrammatic top views of example arrangements of polynucleotide structures in masks.

Referring to FIG. 1, a construction 10 comprises a polynucleotide mask 12. The mask 12 is over an underlying base 14 (visible in openings that extend through mask 12). The underlying base may comprise semiconductor material, and in some embodiments may comprise, consist essentially of, or consist of monocrystalline silicon. In some embodiments, base 14 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 14 may correspond to a semiconductor substrate containing one or more materials associated with integrated circuit fabrication. Some of the materials may correspond to, for example, one or more of refractory metal materials, barrier materials, diffusion materials, insulator materials, etc.

The mask 12 comprises polynucleotide 16, and in the shown embodiment such polynucleotide is subdivided amongst four different structures A-D. The structures are initially provided as separate structures. The separate structures then assemble with one another to form the polynucleotide mask. The illustrated polynucleotide mask has structures A-D joining to one another at interfaces 17-20.

The structures A-D may comprise any suitable compositions and patterns. For instance, the polynucleotide 16 may correspond to DNA and/or RNA, and the structures may comprise, for example, DNA tile assemblies (i.e., DNA canvases), RNA tile assemblies (i.e., RNA canvases) and/or DNA origami configurations. Example structures that may be formed with polynucleotide are described in Wei et al., "Complex shapes self-assembled from single-stranded DNA tiles," Nature, Vol. 485, (May 31, 2012), pp. 623-626; Kershner et al. "Placement and orientation of individual DNA shapes on lithographically patterned surfaces," Nature Nanotechnology, (Aug. 16, 2009), pp. 1-4; and Anderson et al., "Self-assembly of a nanoscale DNA box with a controllable lid," Nature Vol. 459, (May 7, 2009), pp. 73-76.

The illustrated pattern of FIG. 1 comprises the structures A-D in a particular sequence, and in particular orientations. Each of the structures A-D comprises a plurality of openings 22, with the openings having specific shapes and orientations in the illustrated polynucleotide mask 12.

Figure 2:
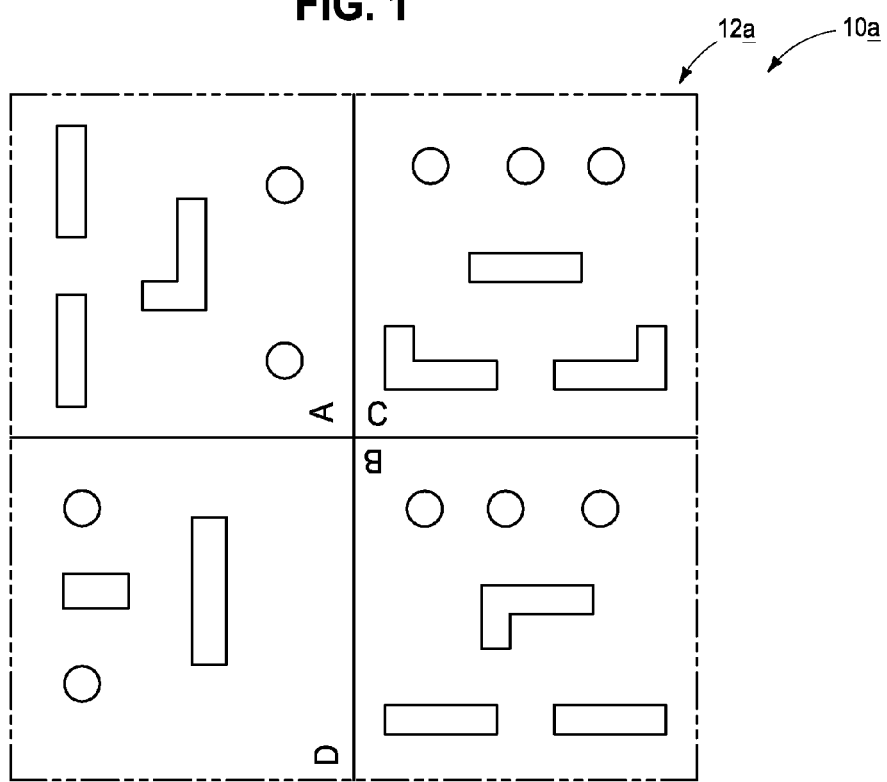

A problem that may occur during formation of a polynucleotide mask is that one or more individual structures of the mask may be out of sequence or out of alignment relative to the desired orientation within the mask, and/or may align with gaps between edges 17-20. For instance, FIG. 2 shows a construction 10a comprising a polynucleotide mask 12a comprising the same structures A-D as the mask 12 of FIG. 1. However, the structures are out of sequence relative to the desired sequence shown in FIG. 1, and some of the structures are rotated relative to the desired orientation shown in FIG. 1.

Figure 3:
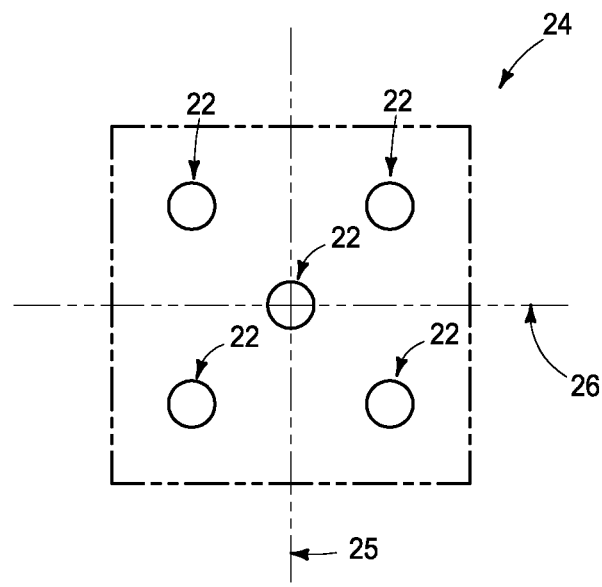
FIGS. 3 and 4 are diagrammatic top views of example polynucleotide structures.
Figure 4:
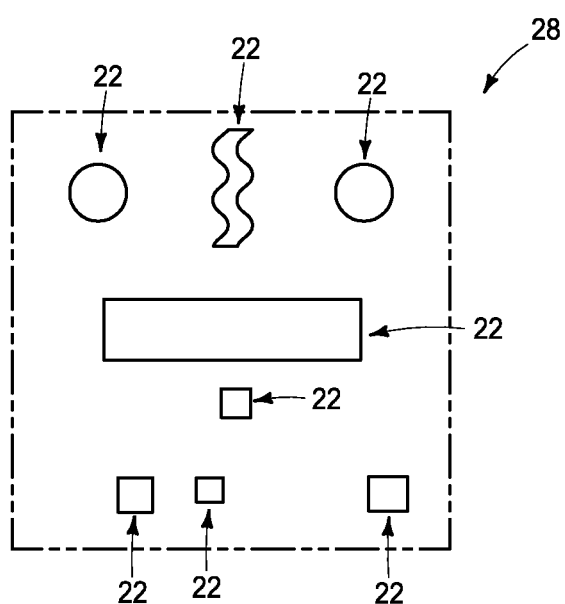

It is noted that a polynucleotide mask may contain some structures which can be in multiple orientations without adversely impacting suitability of the mask. For instance, FIG. 3 shows a structure 24 having openings 22 arranged in a symmetrical manner. Specifically, there are multiple planes of mirror symmetry extending through the structure 24, with two example planes 25 and 26 being shown. Structure 24 thus has multiple symmetrically identical orientations, and any of such orientations may be equally suitable within a polynucleotide mask. In contrast, FIG. 4 shows a structure 28 having no planes of mirror symmetry. There may be only one appropriate orientation for such structure within a polynucleotide mask.

The symmetric structure 24 of FIG. 3 may remove some of the orientation problems associated with incorporation of structures into a polynucleotide mask. Further, if a large number of identical structures are utilized that have high symmetry, it may be possible to remove some of the sequencing problems associated with incorporation of structures within a polynucleotide mask. However, even if some of the orientation and sequencing problems are addressed with symmetry, there will likely remain some orientation and/or sequencing issues that cannot be addressed with symmetry alone. Accordingly, the orientation and sequencing problems illustrated in FIG. 2 may limit suitability of polynucleotide masks for semiconductor fabrication. Specifically, semiconductor fabrication relies on consistent formation of intended masking patterns. Some of the embodiments described herein provide methodology which may eliminate the problems illustrated with FIG. 2.

Figure 5:
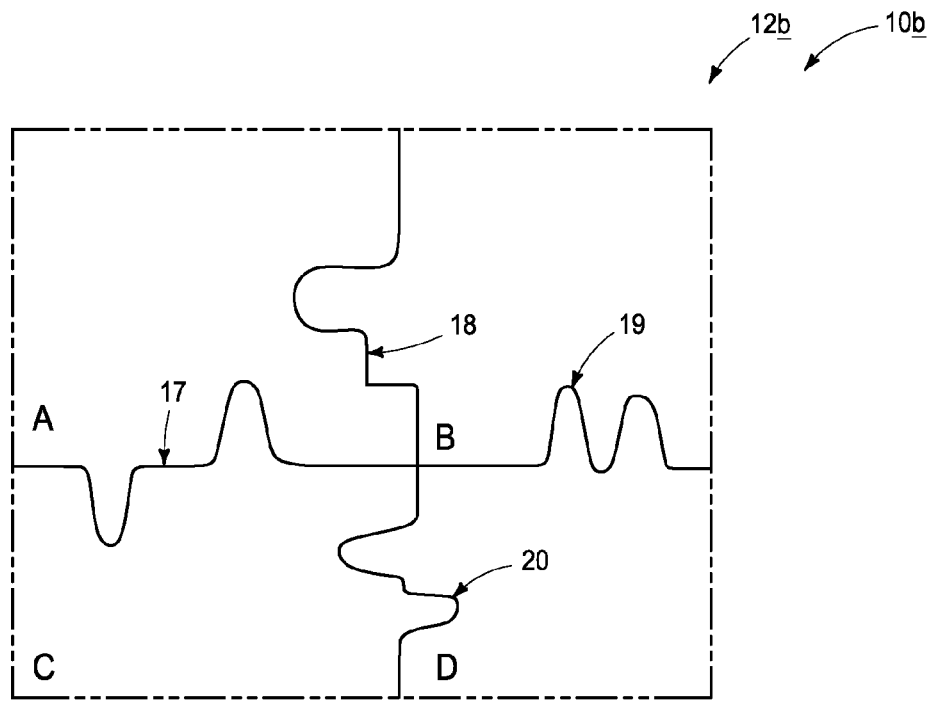
FIGS. 5-7 are diagrammatic top views of example arrangements of polynucleotide structures in masks.

Referring to FIG. 5, a construction 10b comprises an example polynucleotide mask 12b. The polynucleotide mask 12b illustrates an example method for achieving desired sequence and orientation alignment of individual polynucleotide structures. Specifically, the polynucleotide structures A-D are provided with complementary surface shapes which join along the interfaces 17-20. The openings 22 of FIG. 1 are not shown in FIG. 5 in order to simplify the drawing; but such openings, or other suitable openings, may be present within the polynucleotide mask. Although four individual polynucleotide structures (A-D) are shown, it is to be understood that the mask may comprise many more than the four individual polynucleotide structures. It is also to be understood that a mask may comprise fewer than four individual polynucleotide structures in some applications.

The illustrated polynucleotide structures A-D have complementary surface shapes which interdigitate along interfaces 17-20. In other embodiments, other types of complementary surface shapes may be utilized. For instance, FIG. 6 illustrates a portion of a polynucleotide mask 12c in which structures A and C have complementary surface shapes that form a lock-and-key type arrangement along interface 17.

Figure 6:
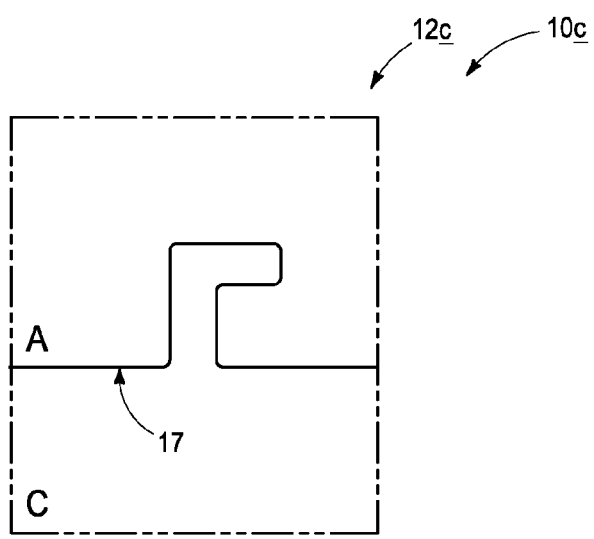

The complementary shapes of FIGS. 5 and 6 are simplistically illustrated to convey the concept that polynucleotide structures A-D may be configured as puzzle pieces that lock together to form a desired polynucleotide mask. In actual practice, the polynucleotide structures may be strands which twist and coil into complex configurations. However, regardless of the complexity of the configurations of individual polynucleotide structures, some embodiments comprise formation of a mixture of polynucleotide structures which contains a set of surface shapes, with some surface shapes being complementary to others so that they may lock together to form a polynucleotide mask. In some applications, the actual surface shapes may be coils that interweave with one another or other intercalated features.

Figure 7:
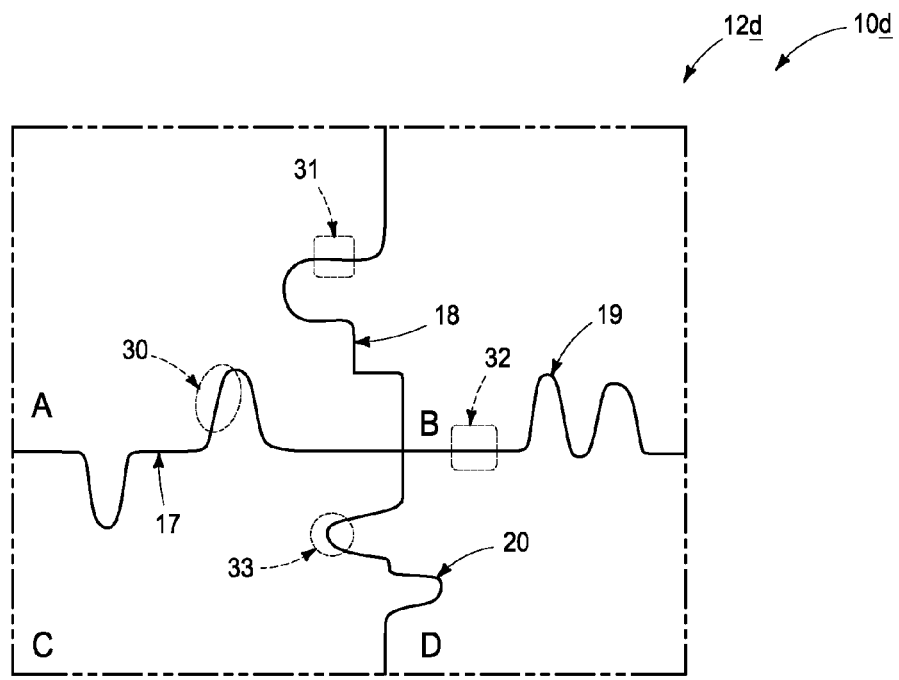

In some embodiments, the physical configuration of the shapes along interfaces 17-20 may be sufficient to hold the structures together as a desired polynucleotide mask during subsequent utilization of such mask. In other embodiments, one or more bonding regions may be provided along the interfaces. For instance, FIG. 7 illustrates a configuration in which bonding regions 30-33 are provided along interfaces 17-20, respectively. The bonding regions comprise complementary areas on the adjacent structures for enhancing adhesion of the adjacent polynucleotide structures to one another (for instance, bonding region 30 comprises complementary areas on adjacent polynucleotide structures A and C).

The bonding regions 30-33 may comprise any suitable configurations. For instance, in some embodiments the bonding regions may be configured to achieve complementary van der Waals forces across an interface and thereby enhance adhesion of adjacent polynucleotide structures to one another. As another example, in some embodiments the bonding regions may comprise complementary base pairing regions along adjacent polynucleotide structures. The base pairing regions may be configured for Watson-Crick base pairing, or for non-Watson-Crick base pairing. As another example, in some embodiments the bonding regions may be configured to form covalent bonds across an interface between adjacent polynucleotide structures.

The illustrated utilization of complementary surface shapes (i.e., the methodologies described with reference to FIGS. 5-7) may lock each of the polynucleotide structures A-D into a particular orientation and sequence relative to the others within a polynucleotide mask, and may thereby alleviate the problems described above with reference to FIG. 2. In some embodiments, all of the polynucleotide structures within the polynucleotide mask are asymmetric (with an example asymmetric structure being described above with reference to FIG. 4), and the complementary surface shapes are configured to lock each polynucleotide structure into only one specific orientation within the polynucleotide mask. In other embodiments, one or more of the polynucleotide structures may have at least one plane of mirror symmetry (with an example structure having mirror symmetry being described above with reference to FIG. 3), and the complementary surface shapes are configured to orient individual polynucleotide structures in any of two or more symmetrically identical orientations within a polynucleotide mask.

Figure 8:
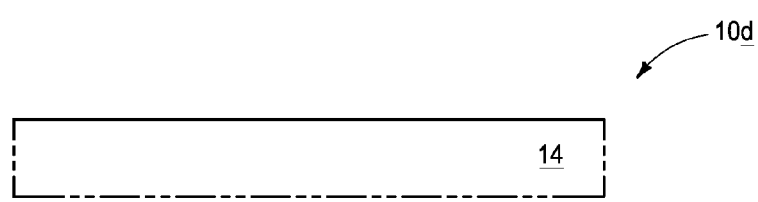
FIGS. 8 and 9 are diagrammatic cross-sectional views of example constructions at process stages of example methods.
Figure 9:
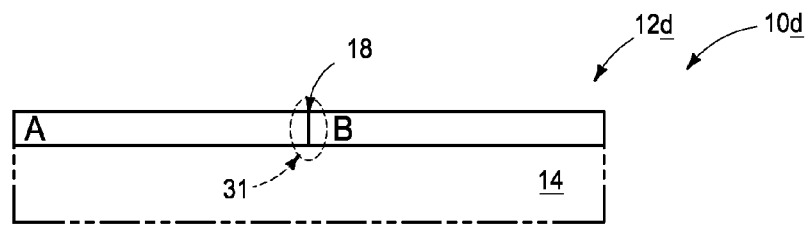

Example processing which may be utilized to form a polynucleotide mask 12d is described with reference to FIGS. 8 and 9. Initially, a semiconductor substrate 14 (shown in FIG. 8) is exposed to a mixture of polynucleotide structures (not shown in FIG. 8). Such polynucleotide structures may be provided proximate the semiconductor substrate, and then may assemble into the polynucleotide mask 12d (shown in FIG. 9). Any suitable conditions may be utilized during adhesion of the polynucleotide structures to the substrate and assembly of the polynucleotide structures into the mask. Such conditions may include, for example, appropriate pH, ionic strength, etc. The polynucleotide mask of FIG. 9 comprises the interface 18 between polynucleotide structures A and B, and also comprises a bonding region 31 along such interface.

The polynucleotide masks of FIGS. 5-7 may be utilized during fabrication of features associated with an underlying semiconductor substrate. Such fabrication may include, for example, incorporation of at least some of the polynucleotide mask into an integrated assembly, etching into a semiconductor substrate while using the polynucleotide mask to define a pattern for the etch, and/or adhering a material to the polynucleotide mask to pattern such material. Example processing that may be conducted with the polynucleotide masks is described below with reference to FIGS. 19-27.

Another example method for aligning individual polynucleotide structures of a polynucleotide mask utilizes registration regions on a substrate to adhere the polynucleotide structures to specific locations.

Figure 10:
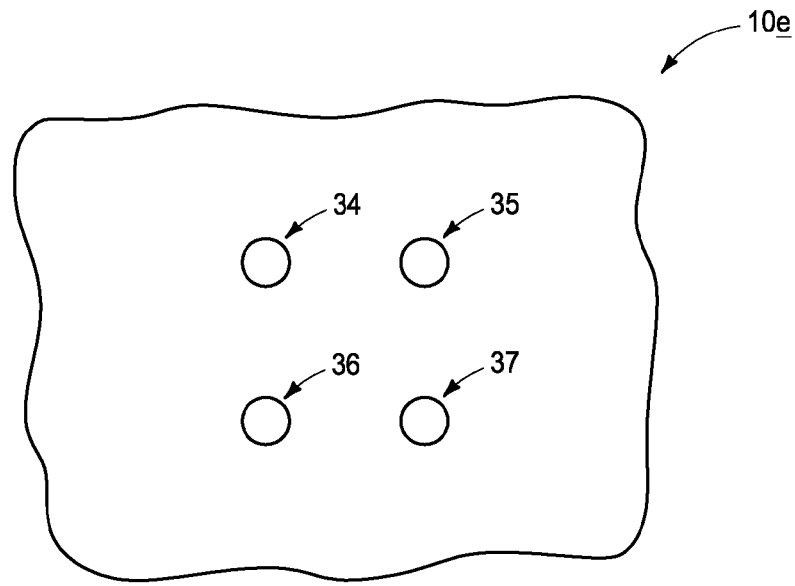
FIG. 10 is a diagrammatic top view on an example semiconductor substrate.

FIG. 10 shows a construction 10e comprising a semiconductor substrate 14 having registration regions 34-37. The registration regions may be any suitable structures or modifications to substrate 14 which adhere the polynucleotide structures. For instance, the regions 34-37 may be configured to attract and/or bond with the polynucleotide structures. In some embodiments, the registration regions may correspond to polynucleotide bases covalently bonded to the substrate 14 and configured for base pairing with individual polynucleotide structures. The base pairing may be Watson-Crick base pairing and/or non-Watson-Crick base pairing. As another example, the registration regions may be configured for covalently bonding to individual polynucleotide structures.

Figure 11:
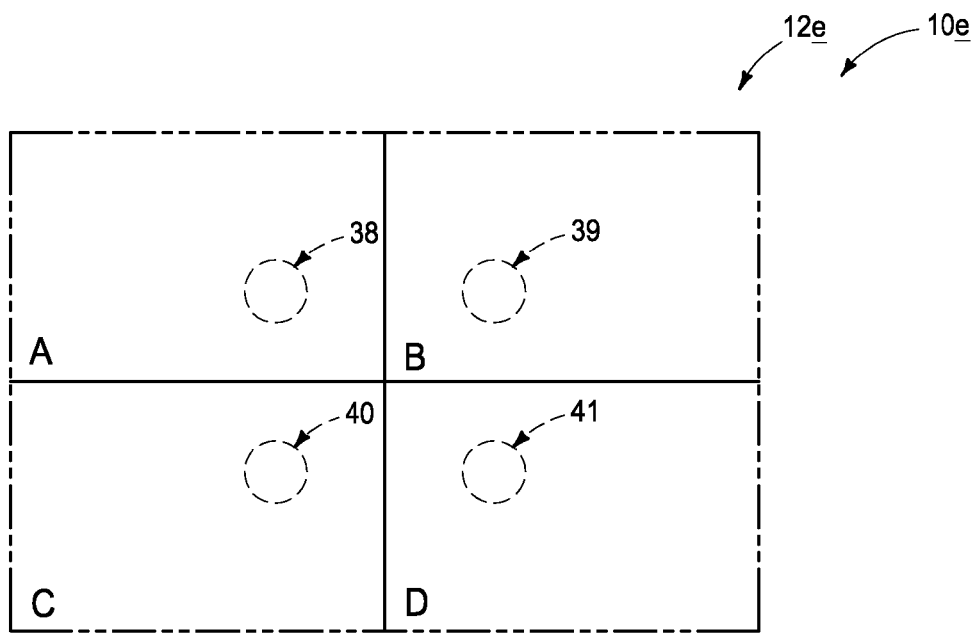
FIG. 11 is a diagrammatic top view of an example arrangement of polynucleotide structures in a mask.
Figure 12:
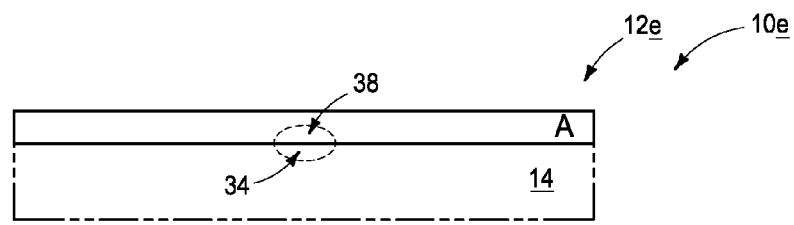
FIG. 12 is a diagrammatic cross-sectional view of a region of a construction comprising a polynucleotide mask over a semiconductor substrate.

Referring to FIG. 11, polynucleotide structures A-D are provided proximate to substrate 14 (FIG. 10), and each of the polynucleotide structures specifically adheres to one of the registration regions. In the shown embodiment, the polynucleotide structures A-D comprise regions 38-41 which are configured for specific interaction with the registration regions 34-37 (FIG. 10). For instance, the regions 38-41 may have base pairs complementary to base pairs of registration regions 34-37 and/or may have chemical groups configured for covalent bonding to chemical groups of registration regions 34-37. FIG. 12 is a cross-sectional view showing the region 38 of polynucleotide structure A adhering with the registration region 34 of semiconductor substrate 14.

Each of the polynucleotide structures A-D may be uniquely configured for adhering to a specific one of the registration regions 34-37, and accordingly the registration regions may be utilized for adhering the polynucleotide structures A-D in a specific sequence and orientation within polynucleotide mask 12e to avoid the problems described above with reference to FIG. 2. The orientation of a specific polynucleotide structure may be a single unique orientation if the polynucleotide structure has no planes of mirror symmetry, or may be any of two or more symmetrically identical orientations if the polynucleotide structure has one or more planes of mirror symmetry.

Although the illustrated embodiment of FIG. 11 utilizes a single registration region per individual polynucleotide structure, in other embodiments one or more of the individual polynucleotide structures may interact with two or more registration regions. The individual registration regions may form one or more interactions with polynucleotide structures to adhere the nucleotide structures. If a registration region forms multiple interactions with a polynucleotide structure (for instance, multiple covalent bonds, multiple base pairing interactions, etc.) the registration region may have any suitable geometric configuration, including, for example, a linear configuration, an annular configurations, etc.; and may be configured so that the single registration region is sufficient to properly orient the polynucleotide structure. In other embodiments, multiple registration regions may be coupled with a single polynucleotide structure to achieve desired orientation of the polynucleotide structure.

In some embodiments, registration regions analogous to those of FIGS. 10-12 may be utilized together with surface structures analogous to those of FIGS. 5-7 to achieve desired alignment of polynucleotide structures within a polynucleotide mask.

In the embodiment of FIG. 11, all of the polynucleotide structures A-D are adhered to registration regions associated with an underlying semiconductor substrate. In other embodiments, a polynucleotide mask may be formed utilizing a combination of some polynucleotide structures adhered to registration regions of a semiconductor substrate, and other polynucleotide structures which are not directly adhered to the semiconductor substrate. An example method of utilizing some polynucleotide structures adhered to registration regions to orient other polynucleotide structures not adhered to registration regions is described with reference to FIGS. 13 and 14.

Figure 13:
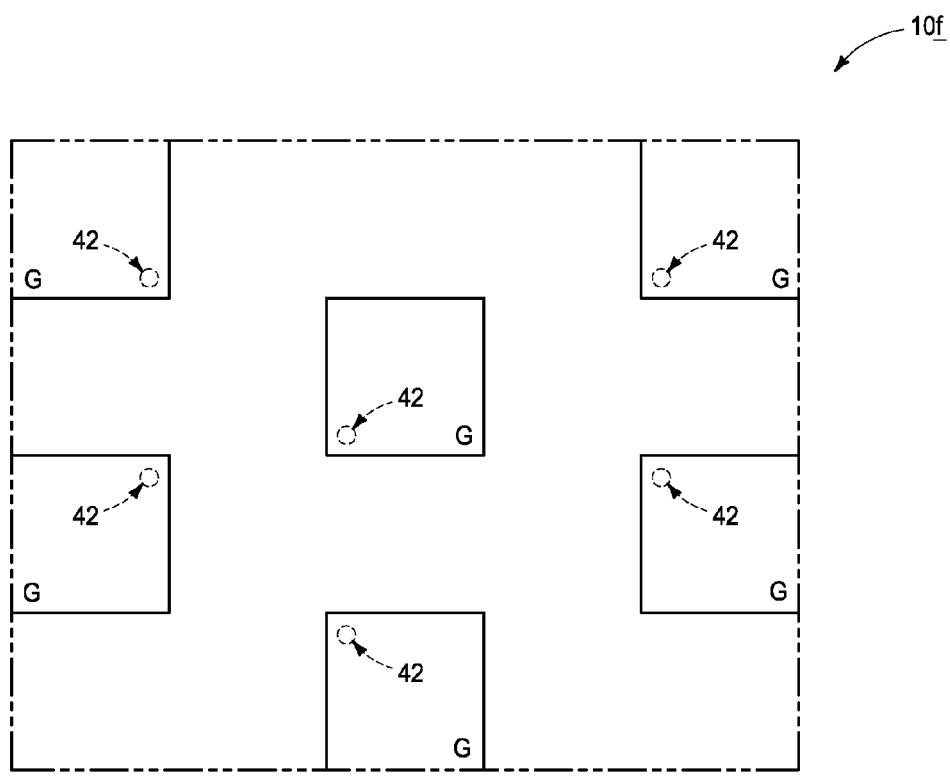
FIGS. 13-18 are diagrammatic top views of example arrangements of polynucleotide structures in masks.

FIG. 13 shows a construction 10f at a processing stage analogous to that of FIG. 11. A plurality of polynucleotide structures G are adhered to a semiconductor substrate utilizing regions 42 of the polynucleotide structures connected to underlying registration regions (not shown) of the semiconductor substrate. The polynucleotide structures G may all be identical to one another in some embodiments, and in other embodiments at least some of the polynucleotide structures G may be different from others. The individual structures G are shown connected to only single registration regions. A single registration region may be sufficient to properly orient a polynucleotide structure; particularly if the registration region forms a sufficient number of interactions with the nucleotide structure (e.g., sufficient number of covalent bonds, sufficient number of base pairs, etc.) in appropriate geometry. If desired, at least some of the polynucleotide structures G may be connected to two or more registration regions to orient the structures.

Figure 14:
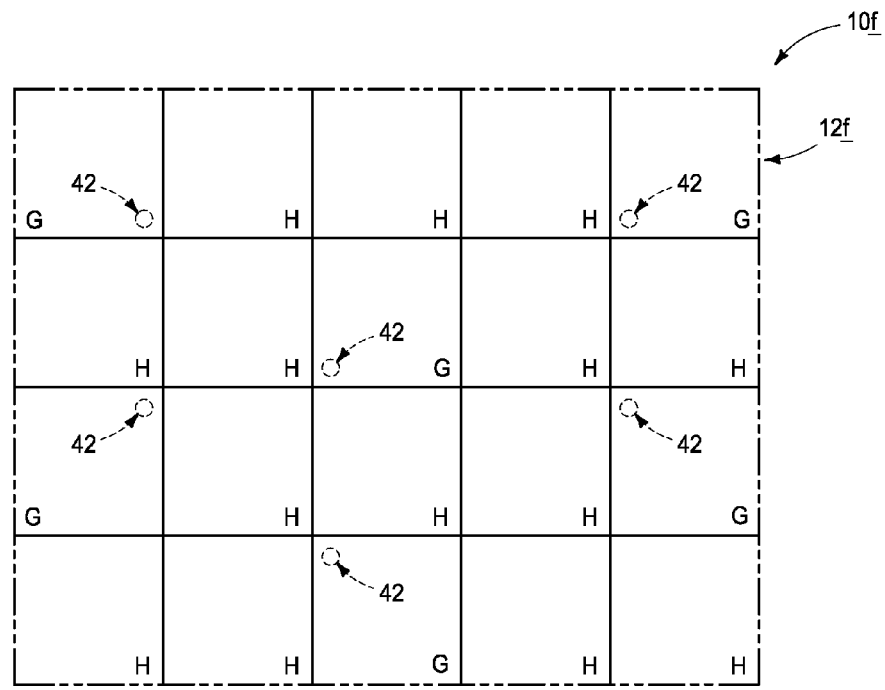

FIG. 14 shows construction 10f after additional polynucleotide structures H are provided, with the additional nucleotide structures being oriented by polynucleotide structures G and completing a polynucleotide mask 12f. The polynucleotide structures H may all be identical to one another in some embodiments, and in other embodiments at least some of the polynucleotide structures H may be different from others. The polynucleotide structures H may be oriented relative to one another and relative to polynucleotide structures G utilizing surface shapes analogous to those described above with reference to FIGS. 5-7 and/or utilizing any other suitable configurations.

The polynucleotide structures G and H may be provided in a single mixture, with polynucleotides within such mixture assembling to form the polynucleotide mask 12f of FIG. 14. Alternatively, the polynucleotide structures G and H may be provided in two mixtures which are sequentially utilized to form the polynucleotide mask 12f. Specifically, a first mixture comprising polynucleotide structures G may be provided proximate to semiconductor substrate 14 to form the construction of FIG. 13. Subsequently, a second mixture comprising polynucleotide structures H may be provided, and the second polynucleotide structures may then assemble to form the completed polynucleotide mask 12f of FIG. 14.

The polynucleotide structures G and H are diagrammatically illustrated as blocks. However, it is to be understood that such polynucleotide structures may have complex shapes corresponding to coiled and/or twisted strands of polynucleotide-type polymer.

The embodiment of FIGS. 13 and 14 utilizes two sets of polynucleotide structures (G and H), with a first set (G) orienting a second set. In some embodiments, processing analogous to that of FIGS. 13 and 14 may be conducted utilizing more than two sets of polynucleotide structures. For instance, a first set may orient a second set, which in turn orients a third set, etc.

The polynucleotide mask 12f of FIG. 14 may be utilized during fabrication of features associated with an underlying semiconductor substrate. Such fabrication may include, for example, incorporation of at least some of the polynucleotide mask into an integrated assembly, etching into a semiconductor substrate while using the polynucleotide mask to define a pattern for the etch, and/or adhering a material to the polynucleotide mask to pattern such material. Example processing that may be conducted with the polynucleotide mask is described below with reference to FIGS. 19-27.

In some embodiments, it may be desired to form a polynucleotide mask having two or more sets of different features. For instance, a polynucleotide mask may be configured for patterning features associated with a memory array, and for patterning features associated with peripheral circuitry adjacent the memory array. The features associated with the memory array may be more tightly packed than those associated with the peripheral circuitry. It may be beneficial to utilize two or more sets of polynucleotide structures for generating a polynucleotide mask configured for patterning the different features. Example embodiments are described with reference to FIGS. 15-18.

Figure 15:
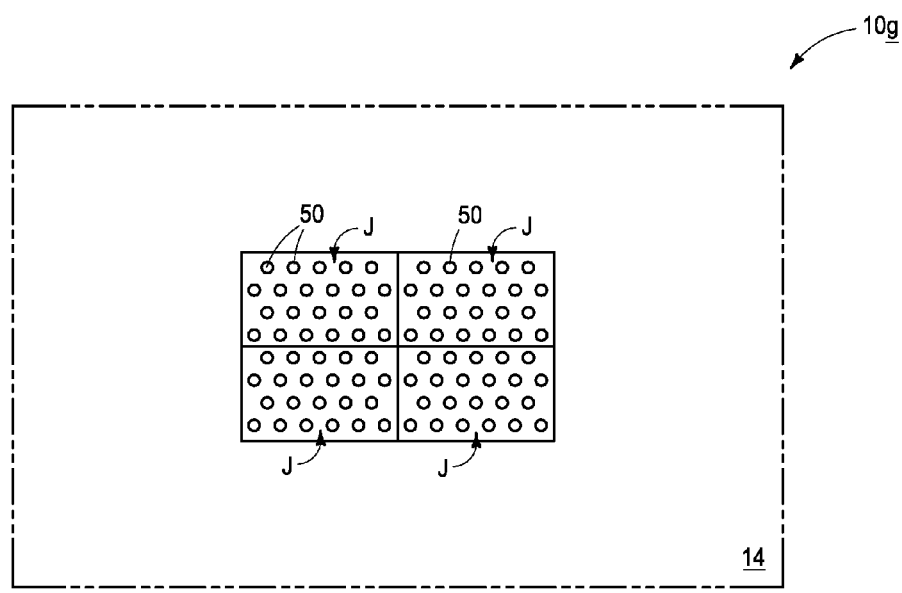

Referring to FIG. 15, a construction 10g comprises a first set of polynucleotide structures J over a first region of a semiconductor substrate 14. In the shown embodiment, the polynucleotide structures J are over a central region of the semiconductor substrate. The polynucleotide structures J may be adhered to the substrate in a specific orientation and sequence by utilizing registration regions (not shown) analogous to the regions 34-37 of FIG. 10 to adhere one or more of the polynucleotide structures J to substrate 14. In some embodiments, all of the polynucleotide structures J are individually adhered to semiconductor substrate 14 with registration regions. In other embodiments, only a subset of the polynucleotide structures J is adhered to the substrate 14 with registration regions; and others of the polynucleotide structures J are not adhered directly to the substrate, but rather are aligned to the adhered structures. The structures J may align to one another utilizing complementary surfaces analogous to those described above with reference to FIGS. 5-7, and/or utilizing any other suitable configurations.

In the illustrated embodiment, the polynucleotide structures J comprise densely-packed patterning constituents 50 (only some of which are labeled). The patterning constituents are shown as circular openings extending through the polynucleotide features, but in other embodiments may comprise other configurations. The densely-packed constituents 50 may be spaced from one another by dimensions of less than 10 nm, less than 5 nm, etc.; and in some embodiments may be utilized for patterning features associated with memory. The polynucleotide structures J are shown to be identical to one another, but in other embodiments at least some of the polynucleotide structures J may be different relative to others of the polynucleotide structures J. The polynucleotide structures J may be initially provided adjacent semiconductor substrate 14 in a mixture, whereupon the polynucleotide structures J assemble across semiconductor substrate 14 to create a desired configuration.

Figure 16:
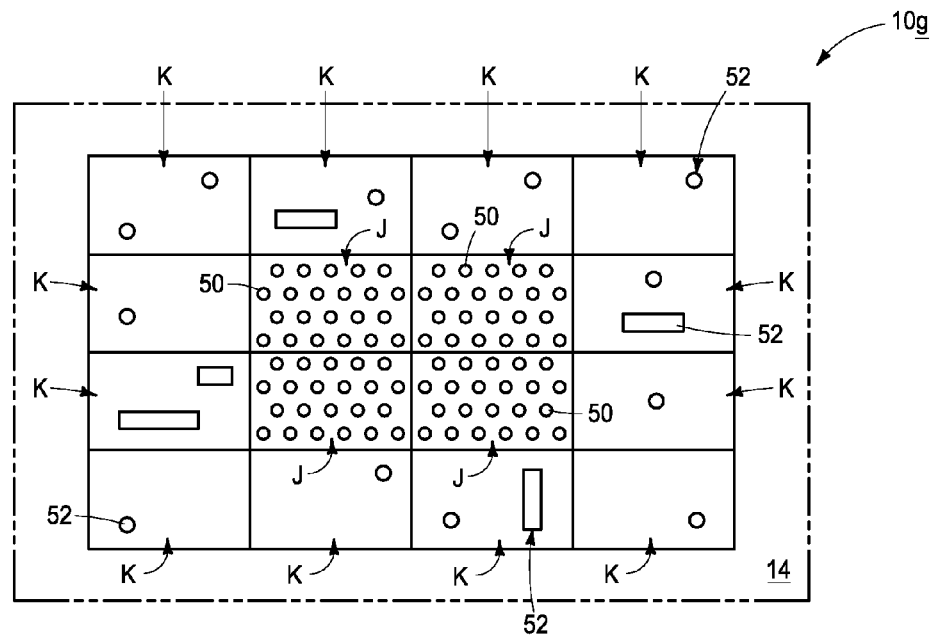

The polynucleotide structures J form a first portion of a polynucleotide mask. Referring to FIG. 16, the polynucleotide structures J are utilized to orient a second set of polynucleotide structures K. The second set of polynucleotide structures K form a second portion of the polynucleotide mask, and in some embodiments may be considered to propagate the second portion of the polynucleotide mask from the first portion generated with polynucleotide structures J. The polynucleotide structures K may be within the mixture comprising polynucleotide structures J, or may be provided in a second mixture different from that which comprises polynucleotide structures J.

The polynucleotide structures K comprise patterning constituents 52 (only some which are labeled). The patterning constituents 52 comprise numerous different types (for instance, some are illustrated as circles and some are illustrated as rectangles), and are less densely packed than the constituents 50. In some embodiments, patterning constituents 50 may be utilized for forming features associated with memory array architecture, and patterning constituents 52 may be utilized for forming architecture peripheral to the memory array. In other embodiments, the masking constituents 50 and 52 may be utilized for patterning features of other integrated architectures.

In the shown embodiment, polynucleotide structures K form a second portion of a polynucleotide mask, with such second portion entirely surrounding the first portion of the polynucleotide mask. In other embodiments, the second portion may not entirely surround the first portion of the polynucleotide mask. In the shown embodiment, the polynucleotide mask formed with polynucleotide structures J and K only partially covers semiconductor substrate 14 (as shown in FIG. 16). In other embodiments, the polynucleotide mask may entirely cover semiconductor substrate 14. In the shown embodiment the polynucleotide mask is the only mask over the semiconductor substrate 14, but in other embodiments the polynucleotide mask may be utilized in conjunction with other masks, such as, for example, photolithographically-patterned masks, masks formed utilizing pitch-multiplication methodologies (i.e., methodologies which decrease pitch to sub-lithographic dimensions), etc.

The embodiment of FIGS. 15 and 16 forms the densely-packed patterning constituents 50 within an interior, central region of the mask, and forms the less-densely-packed constituents 52 outwardly of the densely-packed constituents. In other embodiments, other configurations may be utilized. For instance, densely-packed constituents and less-densely-packed constituents may alternate across regions of a polynucleotide mask, densely-packed constituents may be formed outwardly of centrally-located less-densely-packed constituents, etc.

Figure 17:
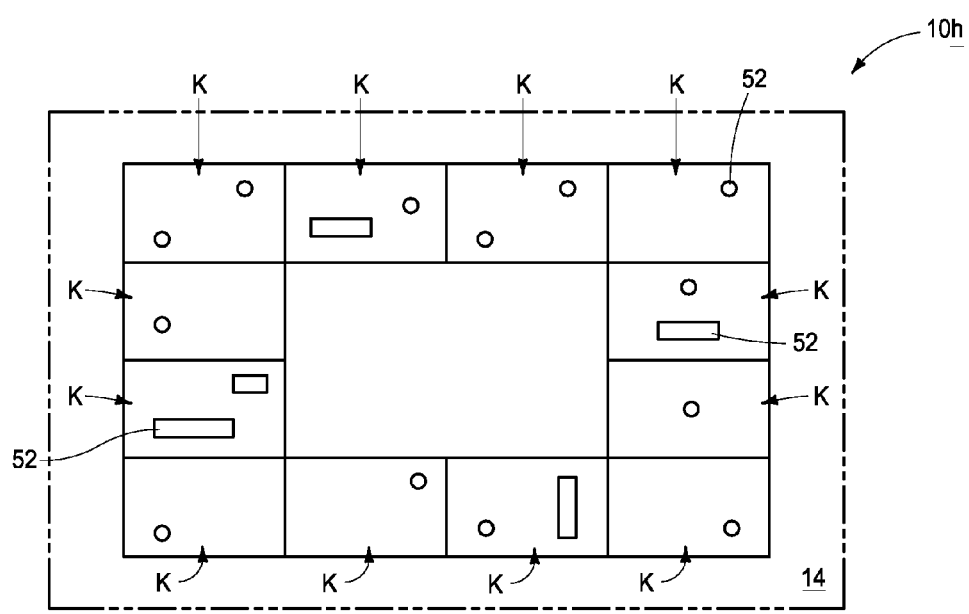

In some embodiments, a centrally-located first portion of a polynucleotide mask may be formed prior to another portion of the polynucleotide mask, as shown in FIGS. 15 and 16. In other embodiments, the centrally-located portion may be formed subsequent to another portion. For instance, FIG. 17 shows a construction 10h comprising polynucleotide structures K assembled across a semiconductor substrate 14. In some embodiments, one or more of the polynucleotide structures K may be adhered to substrate 14 through registration regions of the type described with reference to FIGS. 10 and 11.

Figure 18:
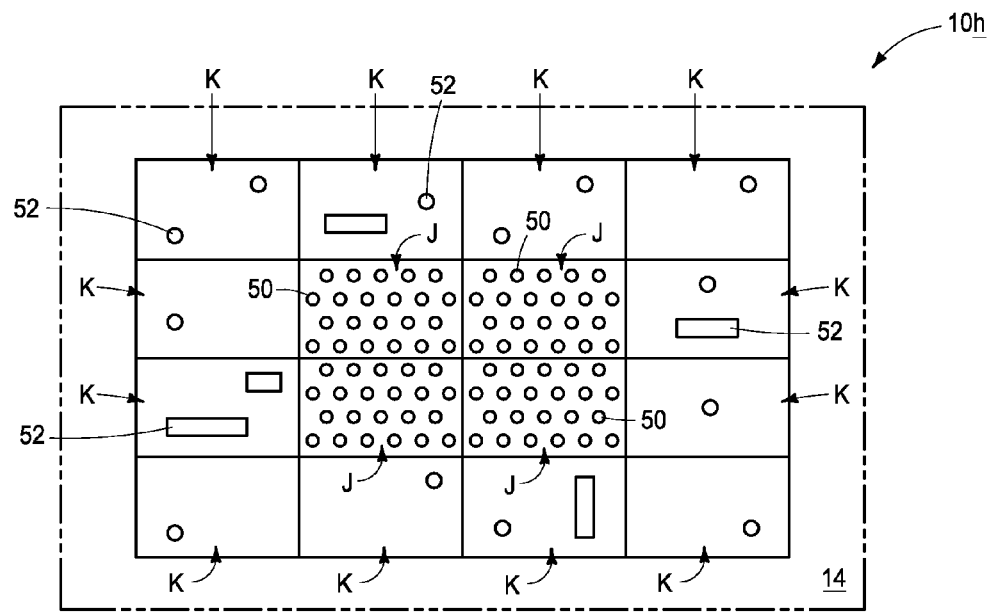

FIG. 18 shows the polynucleotide structures J assembling within a central region surrounded by the polynucleotide structures K. The polynucleotide structures J and K together form a polynucleotide mask. Adjacent polynucleotide structures within the polynucleotide mask of FIG. 18 may interface through complementary surface structures analogous to those described above with reference to FIGS. 5-7, and/or through any other suitable configurations.

The polynucleotide mask of FIG. 18 may be utilized during fabrication of features associated with an underlying semiconductor substrate. Such fabrication may include, for example, incorporation of at least some of the polynucleotide mask into an integrated assembly, etching into a semiconductor substrate while using the polynucleotide mask to define a pattern for the etch, and/or adhering a material to the polynucleotide mask to pattern such material. Example processing that may be conducted with the polynucleotide mask is described below with reference to FIGS. 19-27.

Figure 19:
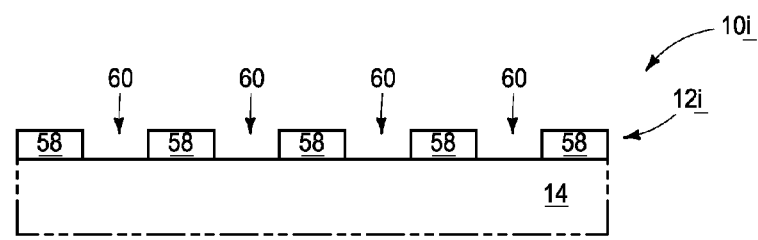
FIGS. 19-27 are diagrammatic cross-sectional views of example constructions at process stages of example methods.

Referring to FIG. 19, a construction 10*i* comprises a polynucleotide mask 12*i* over a semiconductor substrate 14. The mask comprises polynucleotide 58, and has openings 60 extending therethrough.

Figure 20:
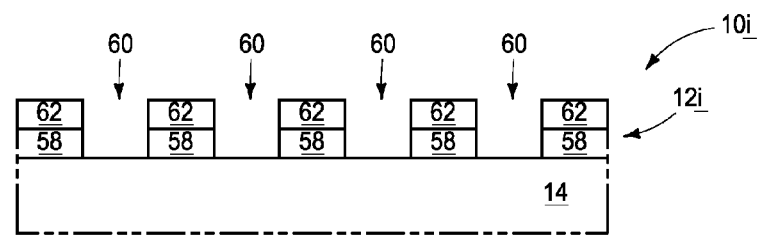

Referring to FIG. 20, a material 62 is selectively formed on an upper surface of polynucleotide 58 relative to upper surfaces of substrate 14. The material 62 may comprise any suitable material. For instance, in some embodiments material 62 may comprise electrically insulative material (for instance, silicon dioxide), or electrically conductive material (for instance, metal or metal-containing compositions). Example methods for adhering material selectively to polynucleotide relative to other surfaces are described in, for example, Surwade et al., "Nanoscale growth and patterning of inorganic oxides using DNA nanostructures templates," Journal of the American Chemical Society (2013), 135, pp 6778-6781.

Figure 21:
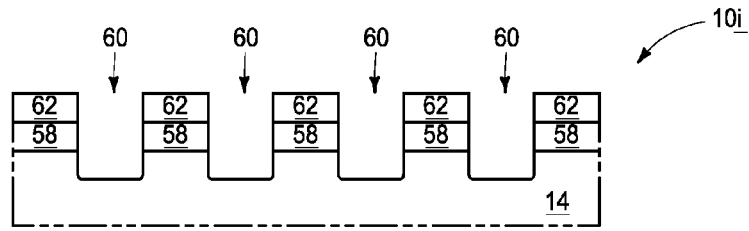
Figure 22:
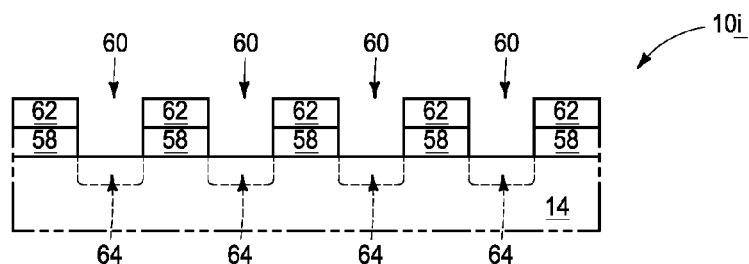

Referring to FIGS. 21 and 22, the material 62 may be utilized as a mask for fabricating features associated with semiconductor substrate 14. FIG. 21 shows an application in which the material 62 is utilized as an etch mask to protect underlying features during an etch into semiconductor substrate 14. FIG. 22 shows an application in which the material 62 is utilized as a mask during implanting of dopant into the exposed regions of a semiconductor substrate 14 to form doped regions 64. The processing of FIGS. 21 and 22 may also be combined so that etching is conducted into the exposed regions of semiconductor substrate 14, and dopant is implanted into the exposed regions. In some embodiments, processing of FIGS. 21 and 22 may be combined with other masking processes (for example, photolithography). Thus, some regions may be protected with a photolithographically-patterned mask during the etch of FIG. 21 and/or the implant of FIG. 22.

The patterns established by material 62 in FIGS. 21 and 22 are defined by the polynucleotide mask formed with polynucleotide 58. Such polynucleotide mask may or may not remain under material 62 during the processing of FIGS. 21 and 22, depending on whether or not the polynucleotide can survive the processing conditions.

Figure 23:
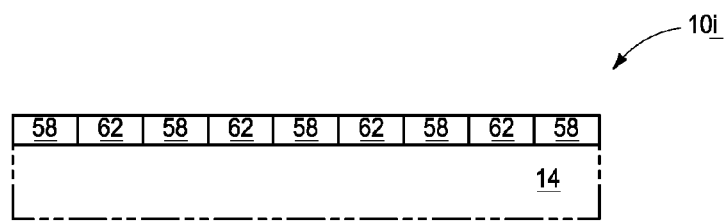

The processing of FIG. 20 forms a positive mask over polynucleotide 58 (i.e., the mask has the same shape as the underlying polynucleotide). In other embodiments, a negative mask may be formed relative to the polynucleotide 58 (i.e., the mask may have a complementary shape relative to the underlying polynucleotide). FIG. 23 shows construction 10*i* at a processing stage subsequent to that of FIG. 19 in accordance with an embodiment in which masking material 62 forms a negative mask relative to polynucleotide 58. Example methods for forming a negative mask relative to polynucleotide are described in, for example, Surwade et al., "Nanoscale growth and patterning of inorganic oxides using DNA nanostructures templates," Journal of the American Chemical Society (2013), 135, pp 6778-6781.

Figure 24:
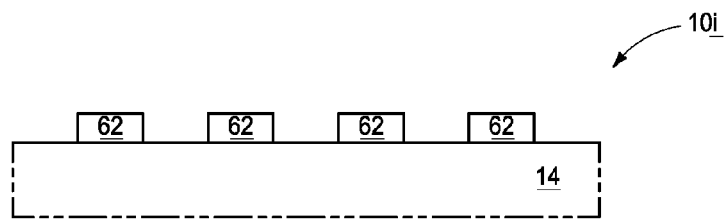

Referring to FIG. 24, the polynucleotide 58 (FIG. 23) is removed.

Figure 25:
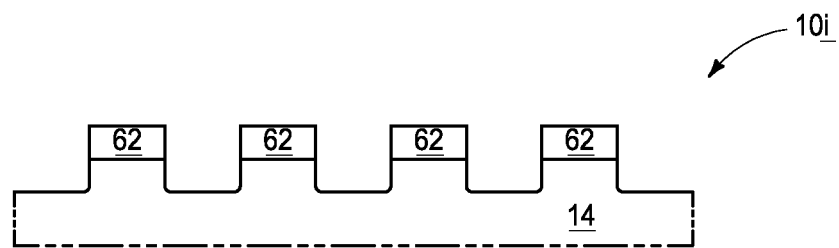
Figure 26:
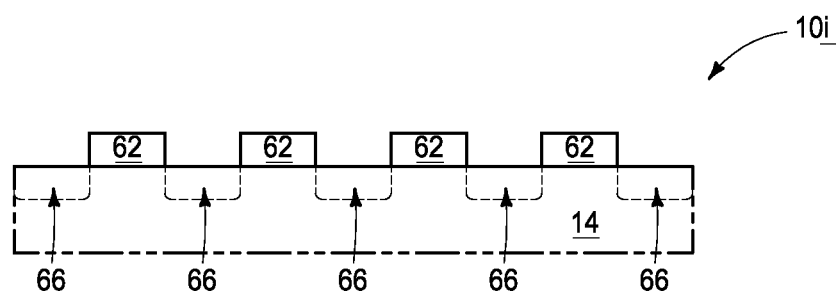

Referring to FIGS. 25 and 26, the material 62 is utilized as a mask for fabricating features associated with semiconductor substrate 14. FIG. 25 shows an application in which the material 62 is utilized as an etch mask to protect underlying features during an etch into semiconductor substrate 14. FIG. 26 shows an application in which the material 62 is utilized as a mask during implanting of dopant into the exposed regions of a semiconductor substrate 14 to form doped regions 66. The processing of FIGS. 25 and 26 may also be combined so that etching is conducted into the exposed regions of semiconductor substrate 14, and dopant is implanted into the exposed regions. In some embodiments, processing of FIGS. 25 and 26 may be combined with other masking processes (for example, photolithography). Thus, some regions may be protected with a photolithographically-patterned mask during the etch of FIG. 25 and/or the implant of FIG. 26.

The patterns established by material 62 in FIGS. 25 and 26 are defined by the polynucleotide mask formed with polynucleotide 58 (FIG. 23), and correspond to an approximate inverse image of such pattern.

Figure 27:
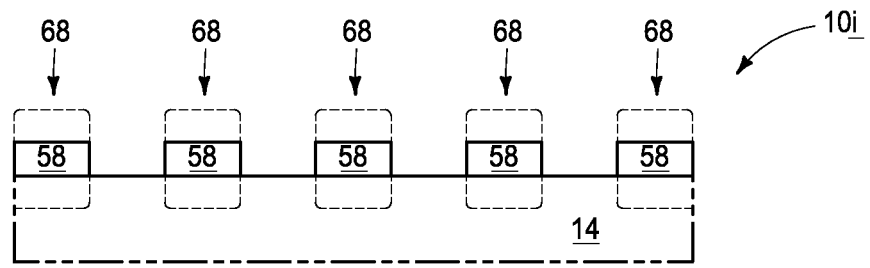

In some embodiments, polynucleotide 58 is a sacrificial material utilized for patterning features associated with semiconductor substrate 14. In other embodiments, at least some of polynucleotide 58 may be incorporated into the features associated with semiconductor substrate 14. In some embodiments polynucleotide 58 may be referred to as a "polynucleotide mask" incorporated into features associated with semiconductor substrate 14. In such embodiments, at least some of the "polynucleotide mask" corresponds to patterned polynucleotide suitable for incorporation into the desired features; and may or may not also be used for patterning etches, implants, etc. as a traditional "mask". FIG. 27 illustrates an example embodiment in which polynucleotide 58 is incorporated into an integrated assembly, and specifically is incorporated into features 68. Such features may comprise, for example, transistors, wiring, etc. The polynucleotide may be an important component of the features. For instance, the polynucleotide may provide desired physical or chemical properties to the features. Further, the polynucleotide may be configured for specific binding to one or more molecules. Such binding may alter electrical properties of the features so that the polynucleotide may be incorporated into an indicator for detecting the presence of such molecules, and possibly also for determining a concentration of the molecules (i.e., sensor applications).

The patterning methods described herein may be applied to fabrication of integrated circuitry (including, for example, logic, memory, wiring, sensors, etc.), fabrication of MEMS (microelectromechanical systems), etc. For instance, in some embodiments the structures J and/or K of FIGS. 16 and 18 may comprise logic devices, sensor devices and/or wiring.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of fabricating features associated with a semiconductor substrate. A mixture of polynucleotide structures is provided proximate the semiconductor substrate. The polynucleotide structures comprise a set of surface shapes with surface shapes of some polynucleotide structures being complementary to surface shapes of other polynucleotide structures. The complementary surface shapes lock together along interfaces between adjacent polynucleotide structures to incorporate the polynucleotide structures into a polynucleotide mask. The polynucleotide mask is used during fabrication of features associated with the semiconductor substrate.

Some embodiments include a method of fabricating features associated with a semiconductor substrate. A mixture of polynucleotide structures is provided proximate the semiconductor substrate. The semiconductor substrate comprises registration regions configured to adhere individual polynucleotide structures to specific locations of the semiconductor substrate. The adhered polynucleotide structures are incorporated into a polynucleotide mask. The polynucleotide mask is used during fabrication of features associated with the semiconductor substrate.

Some embodiments include a method of fabricating features associated with a semiconductor substrate. First polynucleotide structures are provided proximate the semiconductor substrate. The semiconductor substrate comprises registration regions configured to adhere at least some individual first polynucleotide structures to the semiconductor substrate. The adhered first polynucleotide structures are incorporated into a first portion of a polynucleotide mask over a first region of the semiconductor substrate. Second polynucleotide structures are provided proximate the semiconductor substrate. The second polynucleotide structures propagate a second portion of the polynucleotide mask connected with the first portion of the polynucleotide mask. The first and second portions of the polynucleotide mask are used during fabrication of features associated with the semiconductor substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of fabricating features associated with a semiconductor substrate, comprising:
providing a mixture of polynucleotide structures proximate the semiconductor substrate; the polynucleotide structures comprising a set of surface shapes with surface shapes of some polynucleotide structures being complementary to surface shapes of other polynucleotide structures; the complementary surface shapes locking together along interfaces between adjacent polynucleotide structures to incorporate the polynucleotide structures into a polynucleotide mask; and
using the polynucleotide mask during fabrication of features associated with the semiconductor substrate.

2. The method of claim 1 wherein the using of the polynucleotide mask during fabrication of the features includes one or more of incorporating at least some of the polynucleotide mask into an integrated assembly, etching into the semiconductor substrate while using the polynucleotide mask to define a pattern for the etch, and adhering one or more materials to the polynucleotide mask to pattern said one or more materials.

3. The method of claim 1 wherein the complementary surface shapes interdigitate with one another.

4. The method of claim 1 wherein complementary van der Waals force bonding regions are along at least some of the interfaces to enhance adhesion of the adjacent polynucleotide structures to one another.

5. The method of claim 1 wherein complementary base pairing regions are along at least some of the interfaces to enhance adhesion of the adjacent polynucleotide structures to one another.

6. The method of claim 1 wherein covalent bonds are formed along at least some of the interfaces to enhance adhesion of the adjacent polynucleotide structures to one another.

7. The method of claim 1 wherein one or more of individual polynucleotide structures has at least one plane of mirror symmetry, and wherein the complementary surface shapes are configured to orient said one or more of the individual polynucleotide structures in any of two or more symmetrically identical orientations relative to the semiconductor substrate.

8. The method of claim 1 wherein at least one of the individual polynucleotide structures has no planes of mirror symmetry, and wherein the complementary surface shapes are configured to orient said at least one of the individual polynucleotide structures in only one specific orientation relative to the semiconductor substrate.

9. A method of fabricating features associated with a semiconductor substrate, comprising:
providing a mixture of polynucleotide structures proximate the semiconductor substrate; the semiconductor substrate comprising registration regions configured to adhere individual polynucleotide structures to specific locations of the semiconductor substrate;
incorporating the adhered polynucleotide structures into a polynucleotide mask; and using the polynucleotide mask during fabrication of features associated with the semiconductor substrate.

10. The method of claim 9 wherein the using of the polynucleotide mask during fabrication of the features includes one or more of incorporating at least some of the polynucleotide mask into an integrated assembly, etching into the semiconductor substrate while using the polynucleotide mask to define a pattern for the etch, and adhering one or more materials to the polynucleotide mask to pattern said one or more materials.

11. The method of claim 9 wherein the registration regions are configured for base pairing to the individual polynucleotide structures.

12. The method of claim 9 wherein the registration regions are configured for Watson-Crick base pairing to the individual polynucleotide structures.

13. The method of claim 9 wherein the registration regions are configured for covalent bonding to the individual polynucleotide structures.

14. The method of claim 9 wherein the polynucleotide mask only comprises the adhered polynucleotide structures.

15. The method of claim 9 wherein the adhered polynucleotide structures are utilized to orient other polynucleotide structures not adhered directly to the semiconductor substrate; and wherein the polynucleotide mask comprises the adhered polynucleotide structures together with said other polynucleotide structures.

16. The method of claim 15 wherein said other polynucleotide structures are provided in the mixture comprising the individual polynucleotide structures configured to adhere to the registration regions.

17. The method of claim 15 wherein the mixture comprising the individual polynucleotide structures configured to adhere to the registration regions is a first mixture, and wherein said other polynucleotide structures are provided in a second mixture after the individual polynucleotide structures are adhered to the specific locations of the semiconductor substrate.

18. The method of claim 15 wherein said individual polynucleotide structures are first polynucleotide structures having a first set of surface shapes, and wherein said other of the polynucleotide structures are second polynucleotide structures having a second set of surface shapes; at least some of the second surface shapes being complementary to at least some of the first surface shapes; the complementary first and second surface shapes locking together along interfaces between adjacent first and second polynucleotide structures to form the polynucleotide mask from the first and second polynucleotide structures.

19. The method of claim 18 wherein complementary van der Waals force bonding regions are along at least some of the interfaces to enhance adhesion of the adjacent first and second polynucleotide structures to one another.

20. The method of claim 18 wherein complementary base pairing regions are along at least some of the interfaces to enhance adhesion of the adjacent first and second polynucleotide structures to one another.

21. The method of claim 18 wherein covalent bonds are formed along at least some of the interfaces to enhance adhesion of the adjacent first and second polynucleotide structures to one another.

22. The method of claim 9 wherein one or more of the individual polynucleotide structures has at least one plane of mirror symmetry, and wherein the registration regions are configured to orient said one or more of the individual polynucleotide structures in any of two or more symmetrically identical orientations.

23. The method of claim 9 wherein at least one of the individual polynucleotide structures has no planes of mirror symmetry, and wherein the registration regions are configured to orient said at least one of the individual polynucleotide structures in only one specific orientation.

24. A method of fabricating features associated with a semiconductor substrate, comprising:
   providing first polynucleotide structures proximate the semiconductor substrate; the semiconductor substrate comprising registration regions configured to adhere at least some individual first polynucleotide structures to the semiconductor substrate; the adhered first polynucleotide structures being incorporated into a first portion of a polynucleotide mask over a first region of the semiconductor substrate;
   providing second polynucleotide structures proximate the semiconductor substrate; the second polynucleotide structures propagating a second portion of the polynucleotide mask connected with the first portion of the polynucleotide mask; and
   using the first and second portions of the polynucleotide mask during fabrication of features associated with the semiconductor substrate.

25. The method of claim 24 wherein the second polynucleotide structures are provided after the first polynucleotide structures.

26. The method of claim 24 wherein the second polynucleotide structures are provided together with the first polynucleotide structures.

27. The method of claim 24 wherein the first portion of the polynucleotide mask comprises only the first polynucleotide structures adhered to the registration regions.

28. The method of claim 24 wherein the first portion of the polynucleotide mask comprises other polynucleotide structures in addition to the first nucleotide structures adhered to the registration regions.

29. The method of claim 24 wherein the using of the first and second portions of the polynucleotide mask during fabrication of the features includes one or more of incorporating at least some of the polynucleotide mask into an integrated assembly, etching into the semiconductor substrate while using the polynucleotide mask to define a pattern for the etch, and adhering one or more materials to the polynucleotide mask to pattern said one or more materials.

30. The method of claim 24 wherein one of the first and second portions of the polynucleotide mask is utilized for fabricating more densely packed features than the other of the first and second portions of the polynucleotide mask.

31. The method of claim 24 wherein one of the first and second portions of the polynucleotide mask is utilized for fabricating memory array architecture and the other of the first and second portions of the polynucleotide mask is utilized for fabricating architecture peripheral to the memory array.

32. The method of claim 31 wherein said one of the first and second portions of the polynucleotide mask comprises a denser spacing of patterning constituents than said other of the first and second portions of the polynucleotide mask.

33. The method of claim 31 wherein the first portion of the polynucleotide mask is utilized for fabricating the memory array architecture.

34. The method of claim 31 wherein the first portion of the polynucleotide mask is utilized for fabricating the architecture peripheral to the memory array.

35. The method of claim 24 wherein one of the first and second portions of the polynucleotide mask is utilized for fabricating logic devices and the other of the first and second portions of the polynucleotide mask is utilized for fabricating circuitry peripheral to the logic devices.

36. The method of claim 24 wherein the first polynucleotide structures have a set of first surface shapes, and wherein the second polynucleotide structures have a set of second surface shapes, with at least some of the second surface shapes being complementary to at least some of the first surface shapes; the complementary first and second surface shapes locking together along interfaces between adjacent first and second polynucleotide structures to connect the second portion of the polynucleotide mask with the first portion of the polynucleotide mask.

37. The method of claim 36 wherein complementary base pairing regions are along at least some of the interfaces to enhance adhesion of the adjacent first and second polynucleotide structures to one another.

\* \* \* \* \*